United States Patent [19]

Hansen et al.

[11] Patent Number: 5,473,625
[45] Date of Patent: Dec. 5, 1995

[54] TUNABLE DISTRIBUTED BRAGG REFLECTOR LASER FOR WAVELENGTH DITHERING

[75] Inventors: Per B. Hansen, Bradley Beach; Uziel Koren, Fair Haven, both of N.J.

[73] Assignee: AT&T Corp., Murray Hill, N.J.

[21] Appl. No.: 313,519

[22] Filed: Sep. 26, 1994

[51] Int. Cl.$^6$ .................................................. H01S 3/133
[52] U.S. Cl. ........................... 372/96; 372/20; 372/26; 372/32
[58] Field of Search .......................... 372/6, 20, 26, 372/28, 29, 32, 96, 102

[56] References Cited

U.S. PATENT DOCUMENTS

| | | | |
|---|---|---|---|
| 4,434,490 | 2/1984 | Kavaya et al. | 372/20 |
| 4,558,449 | 12/1985 | Gordon | 372/44 |
| 5,064,288 | 11/1991 | Dyes et al. | 372/6 X |
| 5,200,964 | 4/1993 | Huber | 372/26 |
| 5,295,209 | 3/1994 | Huber | 372/6 X |

OTHER PUBLICATIONS

Gain–Switching of DBR Laser Monolithically Integrated with Electroabsorption Modulator for RZ Transmission, *Electronics Letters*, vol. 28, No. 2, Jan. 16, 1992, pp. 188–190, Raybon et al.
Transform–Limited 14ps Optical Pulse Generation with 15 GHz Repetition Rate by InGaAsP Electroabsorption Modulator, *Electronics Letters*, vol. 28, No. 11, May 21, 1992, pp. 1007–1008, Suzuki et al.
Transform–Limited 7–ps Optical Pulse Generation Using a Sinusoidally Driven InGaAsP/InGaAsP Strained Multiple–Quantum–Well DFB Laser/Modulator Monolithically Integrated Light Source, *IEEE Photonics Technology Letters*, vol. 5, No. 8, Aug., 1993, pp. 899–901, Wakita et al.
Optical Pulse Generation with High Repetition Rate by Sinusoidally–Driven InGaAs/InAlAs Multiquantum Well Modulator, *Electronics Letters*, vol. 29, No. 8, Apr. 15, 1993, pp. 718–719, Wakita et al.
Application of a λ/4–Shifed DFB Laser/Electroabsorption Modulator Monolithically Integrated Light Source to Single–Chip Pulse Generator with Variable Repetition Rate, *IEEE Photonics Technology Letters*, vol. 4, No. 10, Oct., 1992, pp. 1129–1132, Suzuki et al.
4.5 Gbit/s Modelocked Extended–Cavity Laser with a Monolithically Integrated Electroabsorption Modulator, *Electronics Letters*, vol. 29, No. 7, Apr. 1, 1993, pp. 639–640, Hansen et al.
A DBR Laser Tunable by Resistive Heating, *IEEE Photonics Technology Letters*, vol. 4, No. 12, Dec., 1992, pp. 1330–1332, Woodward et al.
A Multi–Section Electroapsorption Modulator Integrated DFB Laser for Optical Pulse Generation and Modulation, presented in the European Conference on Optical Communications, Sep., 1993 in Montraux, Switzerland, pp. 313–316, Sato et al.

*Primary Examiner*—John D. Lee

[57] ABSTRACT

An apparatus and method are disclosed for suppressing stimulated Brillouin scattering (SBS) of the output light from a laser such as a distributed Bragg reflector (DBR) semiconductor laser using a tuner which responds to a dither signal to continuously tune the semiconductor laser to reduce stimulated Brillouin scattering therefrom. The tuner responds to a continuously applied sinusoidal current as the dither signal to tune the semiconductor laser by controlling the lasing wavelength thereof. The tuner includes an input region for receiving the dither signal. In a first embodiment, the tuner includes a resistor thermally connected to a passive waveguide of the semiconductor laser, with the resistor responding to the dither signal for continuously heating the passive waveguide to control the tuning of the semiconductor laser. In a second embodiment, the tuner responds to the dither signal to continuously bias the passive waveguide of the semiconductor laser to control the tuning of the semiconductor laser. The tuner continuously injects a biasing current into the passive waveguide of the semiconductor laser to continuously bias the passive waveguide.

30 Claims, 5 Drawing Sheets

16.6980 ns          17.1980 ns          17.6980 ns 16.6980 ns          17.1980 ns          17.6980 ns

10

TUNABLE DISTRIBUTED BRAGG REFLECTOR LASER FOR WAVELENGTH DITHERING

BACKGROUND OF THE INVENTION

1. Field of the Invention

This disclosure relates to tunable lasers, and in particular to a continuously tunable distributed bragg reflector (DBR) laser for suppressing Stimulated Brillouin Scattering.

2. Description of the Related Art

Stimulated Brillouin Scattering (SBS) typically requires artificial broadening of the linewidth of a transmitting laser at average power levels of 8–10 dBm and above, such as for non-return-to-zero (NRZ) signals. Often, artificial broadening is accomplished by direct modulation of the laser. A large linewidth enhancement factor $\alpha$ is desirable to minimize the associated amplitude modulation (AM), which may induce a power penalty in the receiver sensitivity. For very high launch powers the residual AM may be quite significant even when high $\alpha$ lasers are employed and may cause penalties of several dB's.

Tunable semiconductor lasers are known in the art for being selectively tuned to specific lasing wavelengths. S. L. Woodward et al., "A DBR Laser Tunable by Resistive Heating", IEEE PHOTONICS TECH LETTERS, Vol 4, No 12, December 1992, pp. 1330–1332, describes tuning a laser to discrete lasing wavelengths by selectively heating the passive waveguide section and/or the Bragg section of a DBR laser.

In addition, commonly assigned U.S. patent application Ser. No. 08/268,394 to Froberg et al., filed Jun. 30, 1994, entitled DATA ENCODED OPTICAL PULSE GENERATOR, describes a discretely tuned DBR laser having a current selectively applied to a resistor for selecting a temperature of the DBR laser for tuning.

SUMMARY

An apparatus and method are disclosed for suppressing SBS in an optical fiber using a semiconductor laser with a tuner which responds to a dither signal to continuously tune the semiconductor laser to reduce stimulated Brillouin scattering therefrom. The tuner responds to a continuously applied sinusoidal current which is the dither signal to tune the semiconductor laser by controlling the lasing wavelength thereof. The tuner includes an input region for receiving the dither signal.

In a first embodiment, the tuner includes a resistor thermally connected to a passive waveguide of the semiconductor laser, with the resistor responding to the dither signal for heating the passive waveguide to control the tuning of the semiconductor laser. In a second embodiment, the tuner responds to the dither signal to continuously bias the passive waveguide of the semiconductor laser to control the tuning of the semiconductor laser. The tuner continuously injects a biasing current into the passive waveguide of the semiconductor laser to continuously bias the passive waveguide.

BRIEF DESCRIPTION OF THE DRAWINGS

The features of the disclosed tunable DBR laser apparatus and method will become more readily apparent and may be better understood by referring to the following detailed description of an illustrative embodiment of the present invention, taken in conjunction with the accompanying drawings, where.

DESCRIPTION OF THE PREFERRED EMBODIMENTS

Figure 1:
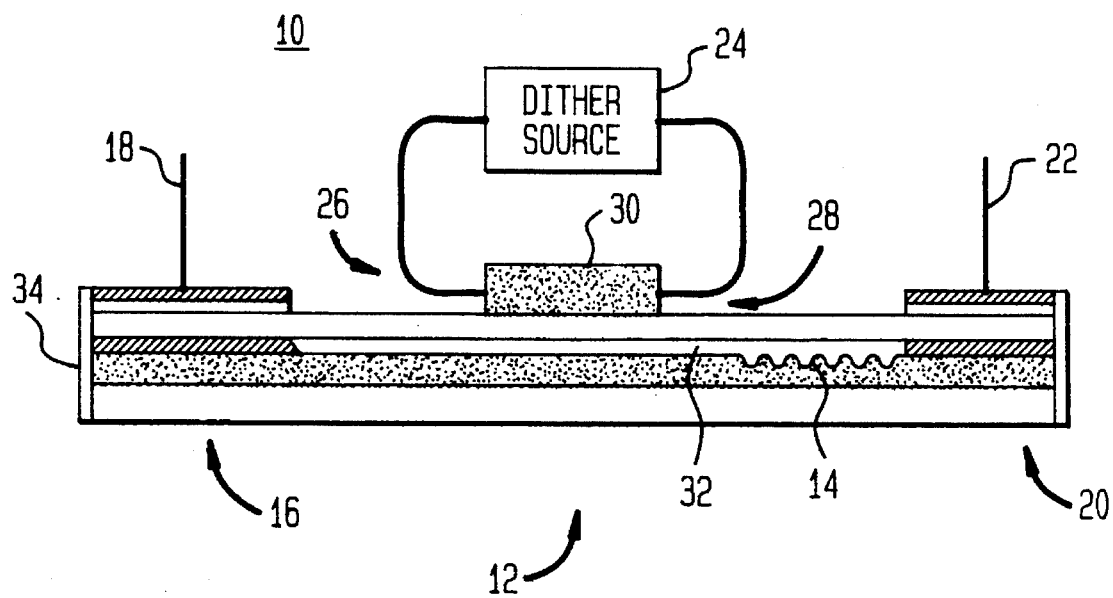
FIG. 1 illustrates the disclosed continuously tunable DBR laser with a resistor for local heating.

Referring now in specific detail to the drawings, with like reference numerals identifying similar or identical elements, as shown in FIG. 1, the present disclosure describes tunable DBR laser apparatus and method for wavelength dithering to suppress SBS in systems employing high launch powers.

Figure 2:
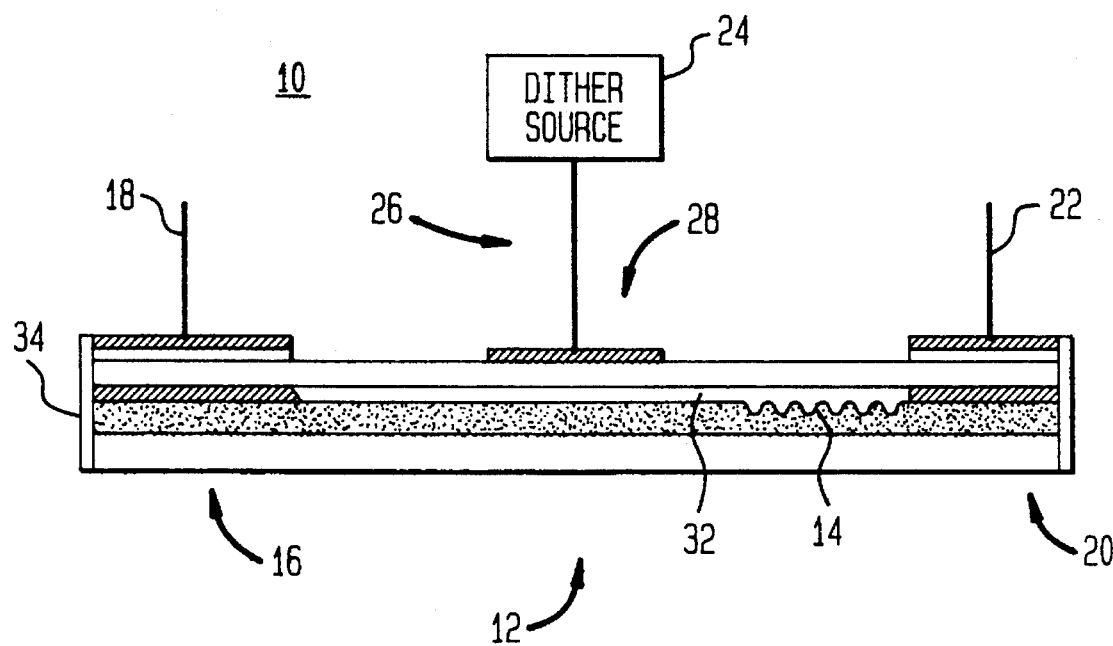
FIG. 2 illustrates an alternative embodiment of the disclosed DBR laser using a bias of a passive waveguide.

Referring to FIGS. 1–2, the tunable semiconductor DBR laser 10 includes an active region 16, passive waveguide section 12, Bragg reflector 14 and a modulator 20 for generating the lasing output. The Bragg reflector 14 including a grating region is provided positioned between the active region or gain section 16 having a DC bias current 18 input thereto and the modulator section 20 for generating a lasing output in response to input data signals 22.

Table 1 below shows exemplary output power data of the laser 10 as a function of the input DC current 18 at a temperature of 20° C.:

TABLE 1

| Laser Diode Current (mA) | Output Power P$_{(out)}$ |
|---|---|
| 10 | −31.1 dBm |
| 15 | −11.9 dBm |
| 20 | −5.94 dBm |
| 30 | −2.11 dBm |
| 40 | 0.02 dBm |
| 50 | 1.20 dBm |
| 60 | 2.21 dBm |
| 70 | 3.01 dBm |
| 80 | 3.47 dBm |

A dither source 24 provides a continuous dither signal, such as a continuous sinusoidal signal. A tuner 26 is provided which is operatively coupled to an input region, and responds to the dither signal for continuously tuning the lasing wavelength to reduce SBS which would otherwise result from launching a high power level into a fiber span.

In a first embodiment, as shown in FIG. 1, the SBS suppression is performed by a tuner circuit 26 continuously tuning the DBR laser 10 by local heating at the input region 28 into a passive waveguide segment using a resistor 30 in a first embodiment. Alternatively, as shown in FIG. 2, the continuous tuning is performed in second embodiment by current injection at the input region 28 to the passive waveguide segment. It is understood that one skilled in the art could apply other means for continuously tuning the DBR laser 10.

In the first embodiment, the wavelength dithering is controlled by the amplitude of the input sinusoidal dithering signal from the dither source 24 at approximately 10 kHz which is applied to a 47 Ohm chip resistor 30 positioned adjacent the passive waveguide 12. The use of the input sinusoidal signal to dither the output lasing wavelengths does not significantly affect other performance characteristics of the DBR laser 10. It is understood that one skilled in the art could apply other continuously varying dither signals to dither the DBR laser 10.

The laser 10 includes the active region 16 and the Bragg reflector 14 with a cavity formed by the left facet 34 and the Bragg reflector 14. The 47 Ohm chip resistor 30 allows the roundtrip time of the lasing energy in the cavity 32 to be controlled by local heating generated by applying a voltage to the resistor 30. This uses the known principle of varying the refractive index of the laser 10 by varying the temperature, and thus varying the lasing wavelength.

In a third embodiment, heating of the active region is used to influence the lasing wavelength. Alternatively, local heating of the grating 14 of the laser 10 provides tunability by selecting the lasing mode without significantly changing the roundtrip time in the cavity 32. Consequently, continuous tuning with constant output power is preferably obtained by positioning the resistor 30 and/or the input region 28 of the passive waveguide segment a minimum distance away from the Bragg reflector 14.

Alternatively, as shown in FIG. 2, the wavelength can be tuned by the tuner 26 applying either forward or a reverse bias by current injection at the input region 28 to the layers of passive waveguide in a manner known in the art.

FIGS. 1–2 show the disclosed tunable DBR laser apparatus in exemplary embodiments for use with a monolithically integrated electroabsorption modulator 20. The performance results of the disclosed tunable DBR laser 10 which are described herein were measured using a device with such a modulator 20. As shown in the exemplary embodiment in FIGS. 1–2, the generated laser light was coupled out of an output facet 34 and an external NRZ modulator was used to encode the input data signals 22.

Figure 3:
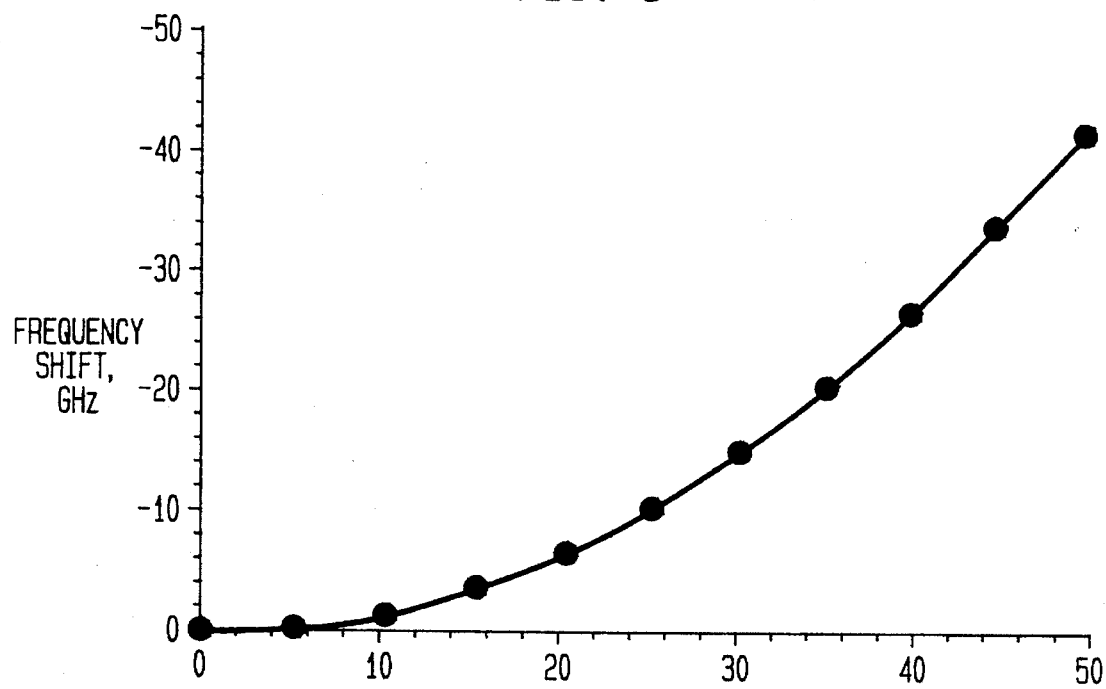
FIG. 3 illustrates the change in lasing frequency as a function of DC resistor current.
Figure 4:
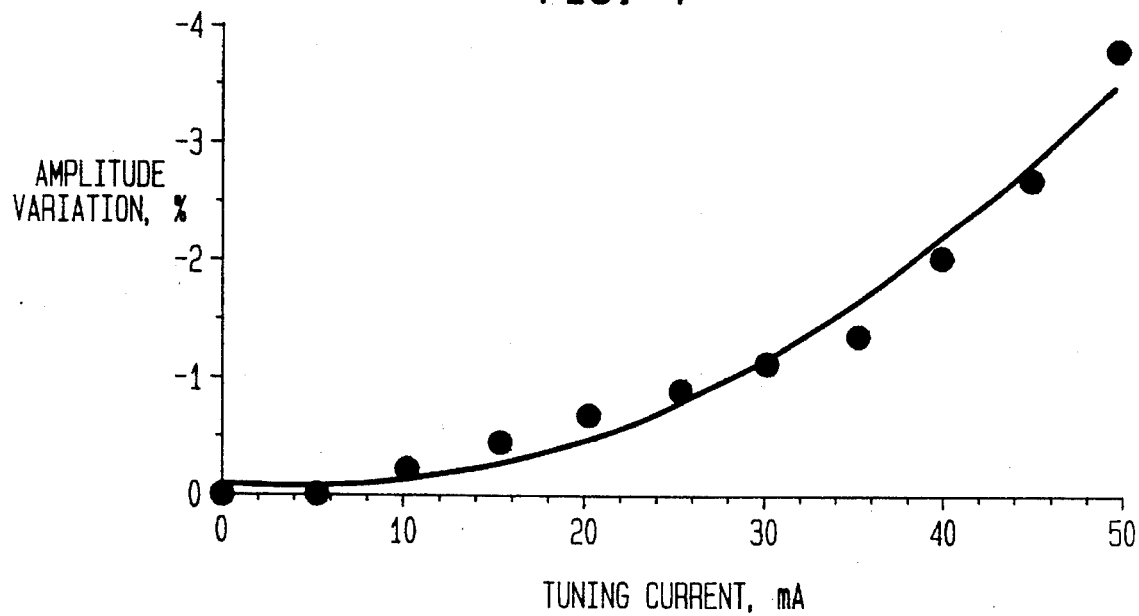
FIG. 4 illustrates a corresponding change in output power.

For the third exemplary embodiment with heating of the active region 16, the following disclosure, in conjunction with FIGS. 3–10, describes obtained output performance data. As disclosed below, the residual AM which accompanies the wavelength dithering is in this case less than one percent for a specified broadening up to 10 GHz. FIGS. 3–4 show the change in lasing wavelength in GHz and the change in output power in percentage against the DC current 18 applied to the resistor 30 in the first embodiment. Frequency changes of 10 GHz may thus be obtained with only a 1% change in the optical output power of the disclosed tunable laser 10.

Table 2 below illustrates exemplary tuning data corresponding to FIGS. 3–4 at a temperature T=20° C., with a constant DC current $I_{LD}$=53.3 mA.

FIG. 3 displays the fourth column vs. the first column of Table 2, with each value in the fourth column offset by the first entry in that column; i.e. each value is reduced by 192.4089 to be plotted in FIG. 3. FIG. 4 displays the second column vs. the first column of Table 2, with each value in the second column offset and normalized by the first entry in that column; i.e. each value is reduced by 2.20 and the reduced value is divided by 2.20 to be plotted in FIG. 4.

TABLE 2

| $I_{Tuning}$/mA | $P_{out}$/dBm | $\lambda_0$/nm | $(1/\lambda_0)$ /THz |
|---|---|---|---|
| 0 | 2.20 | 1558.102 | 192.4089 |
| 5 | 2.20 | 1558.105 | 192.4086 |
| 10 | 2.19 | 1558.115 | 192.4074 |
| 15 | 2.18 | 1558.132 | 192.4053 |
| 20 | 2.17 | 1558.156 | 192.4025 |
| 25 | 2.16 | 1558.186 | 192.3387 |
| 30 | 2.15 | 1558.224 | 192.3341 |
| 35 | 2.14 | 1558.268 | 192.3887 |
| 40 | 2.11 | 1558.318 | 192.3824 |
| 45 | 2.08 | 1558.377 | 192.3752 |
| 50 | 2.03 | 1558.440 | 192.3671 |

Figure 5:
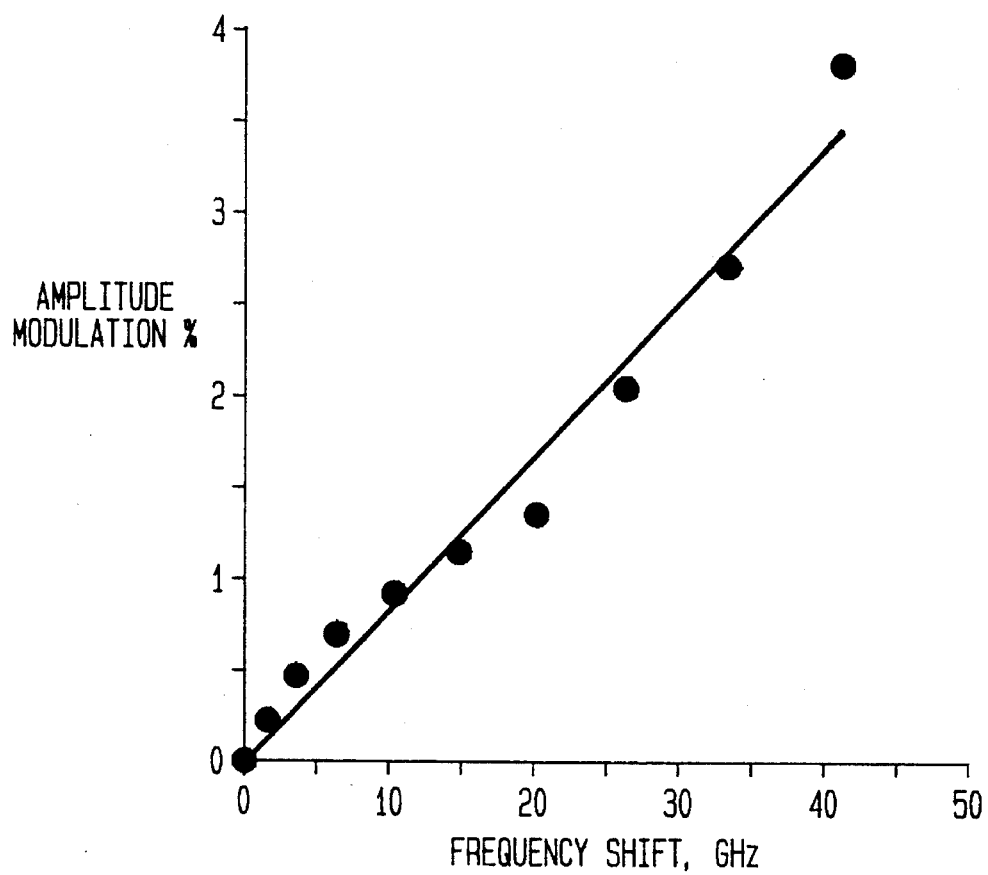
FIG. 5 illustrates a change in optical output power versus change of lasing frequency.
Figure 6:
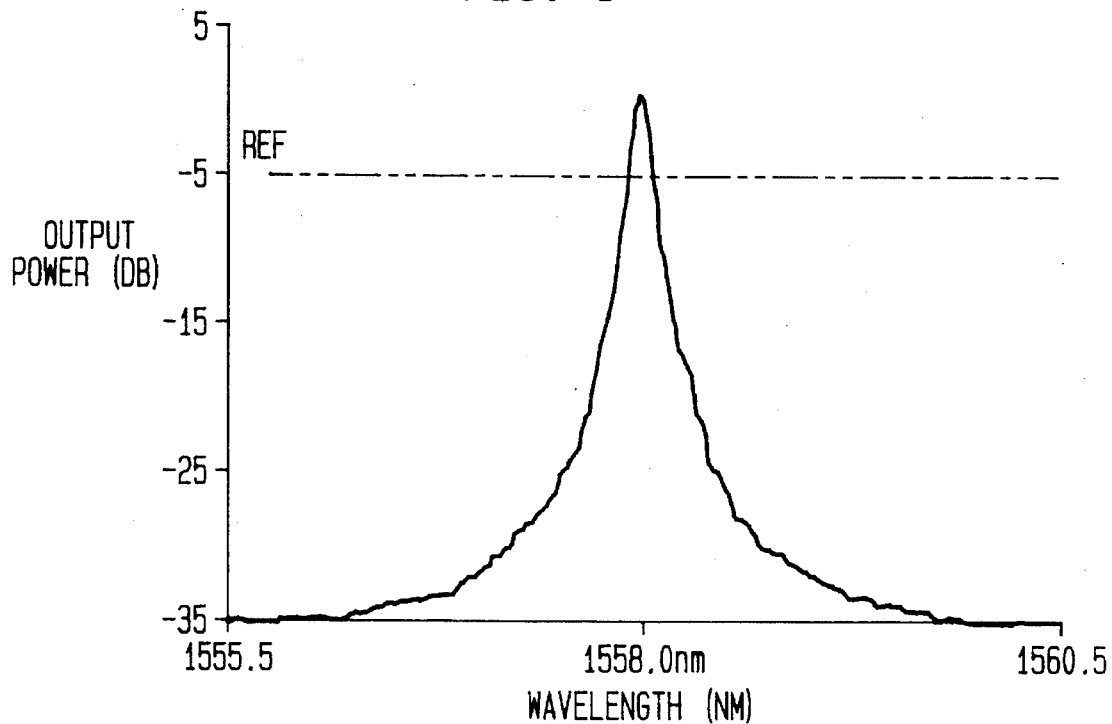
FIG. 6 illustrates an optical spectrum measured on an optical spectrum analyzer.

FIG. 5 illustrates the amplitude modulation plotted as a function of the frequency shift. In the disclosed example, an optimal linear fit has a slope of 0.083%/GHz. FIG. 6 illustrates an exemplary optical spectrum of the disclosed tunable laser 10, with the optimal spectrum remaining single-moded over an entire 50 mA tuning range of currents.

Table 3 below illustrates exemplary dither data for the laser 10 operating at 10 kHz, at a temperature of 20° C., and with the DC current $I_{LD}$=62 mA An isolator of 1.5 dBm loss is used to prevent reflections. Suppression of SBS generally requires a dither frequency of more than approximately 7 kHz. The calibration is 957 μs for approximately 4.97 GHz.

TABLE 3

| $I_{pp}$/ma | Δt/μs | FWHM/GHz |
|---|---|---|
| 10 | 117 | 0.608 |
| 15 | 312 | 1.622 |
| 20 | 615 | 3.198 |
| 25 | 1035 | 5.382 |
| 30 | 1504/1592 | 7.821/8.278 |
| 35 | 2109 | 10.967 |
| 40 | 2765 | 14.378 |

Figure 7:
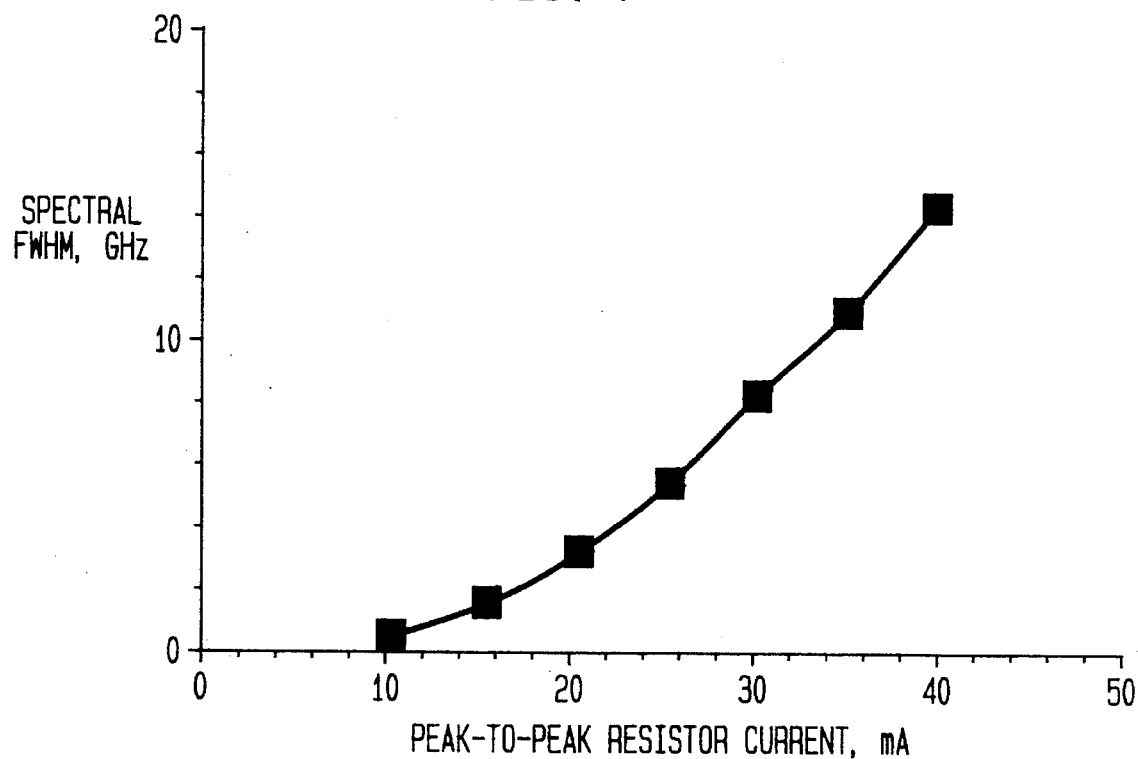
FIG. 7 shows the spectral FWHM versus peak-to-peak resistor current for a 10 kHz sinusoid.

FIG. 7 illustrates the data in Table 3 where the third column is plotted against the first column, showing the full width at half maximum (FWHM) spectral width as a function of the peak-to-peak current of a 10 kHz sinusoid signal as the dither signal from the dither source. A spectral width of 14.4 GHz is measured for 40 mA peak-to-peak (pp) currents. The spectral width measured for a 10 kHz sinusoidal modulation is approximately 3 dB less than the change in wavelength with a DC current 18 through the resistor 30 because of the thermal diffusion time constant. However, both the index and the gain (or loss) of the semiconductor laser 10 react locally to the temperature of the material on time scales below 1 picosecond (ps). Consequently, the ratio between the frequency and the amplitude variation is expected to be independent of the dithering frequency.

Figure 8:
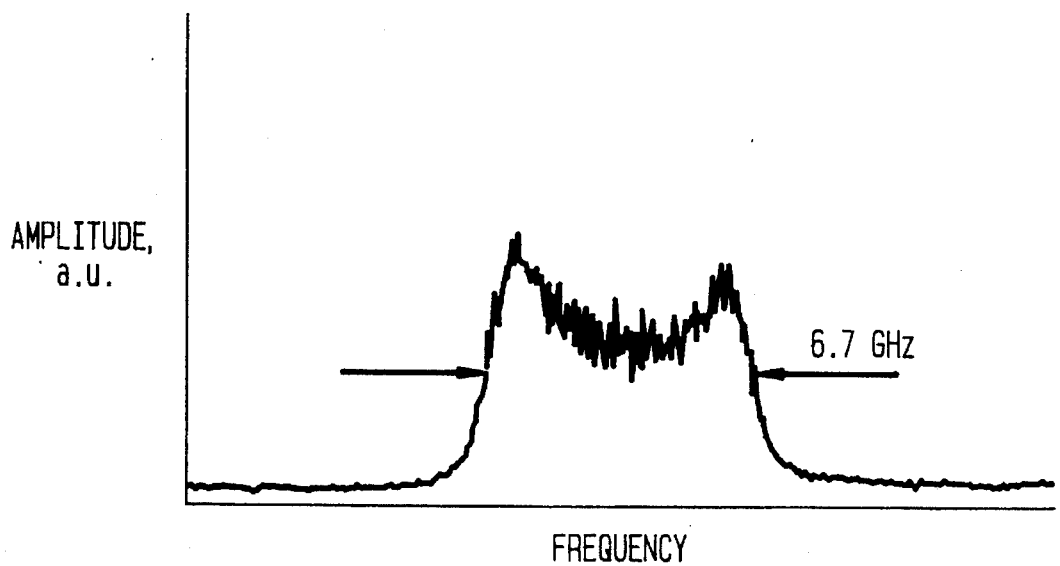
FIG. 8 shows a time averaged spectrum with 27.7 mA$_{pp}$ dithering at 10 kHz.
Figure 9:
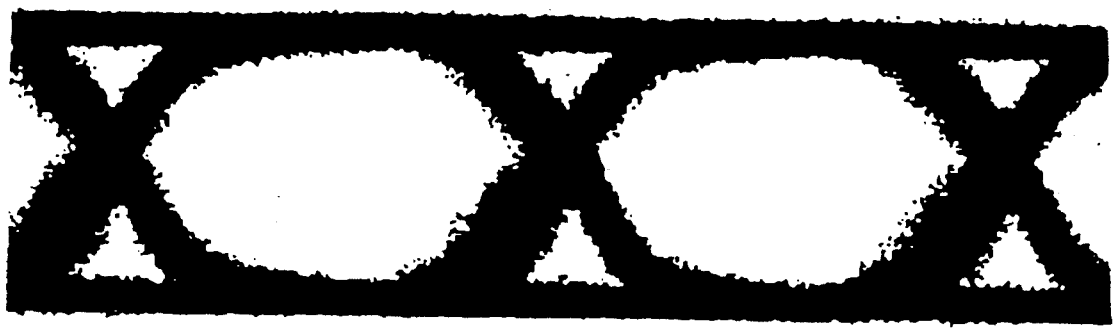
FIG. 9 illustrates an eye pattern with 6.7 GHz wavelength dithering for a 27.7 mA$_{pp}$ dither current at 10 kHz.
Figure 10:
FIG. 10 shows an eye pattern without wavelength dithering.

FIG. 8 shows an approximately 6.7 GHz wide spectrum obtained with 27.7 mA$_{pp}$ as the dither signal from the dither source 24, with a corresponding voltage of 1.3 V$_{pp}$. From FIG. 5, the expected residual AM signal is less than 0.7%. As shown in FIG. 9, the corresponding eye pattern of the performance of the laser 10 with such a 27.7 mA$_{pp}$ dither signal shows no visible AM. In comparison, the eye pattern measured without any dither signal applied to the resistor 30 is shown in FIG. 10. FIGS. 9–10 are substantially identical, indicating that the suppression of SBS by continuous dithering as disclosed herein does not contribute to AM of the laser output.

While the disclosed tunable DBR laser apparatus and method has been particularly shown and described with reference to the preferred embodiments, it will be understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. An apparatus for suppressing stimulated Brillouin scattering caused by a semiconductor laser comprising:

a source of a dither signal; and a tuner, operatively connected to the semiconductor laser and responsive to the dither signal, for continuously tuning the semiconductor laser to reduce stimulated Brillouin scattering caused therefrom.

2. The apparatus of claim 1 wherein the tuner responds to a continuously applied current as the dither signal to tune the semiconductor laser by controlling the lasing wavelength thereof.

3. The apparatus of claim 2 wherein the continuously applied current is a continuous sinusoidal current.

4. The apparatus of claim 1 wherein the tuner includes an input region for receiving the dither signal.

5. The apparatus of claim 1 wherein the tuner includes a resistor thermally connected to a portion of the semiconductor laser, the resistor responsive to the dither signal for continuous heating thereof to control the tuning of the semiconductor laser.

6. The apparatus of claim 5 wherein the resistor is thermally connected to a passive waveguide of the semiconductor laser for continuous heating thereof.

7. The apparatus of claim 5 wherein the resistor is thermally connected to an active region of the semiconductor laser for continuous heating thereof.

8. The apparatus of claim 5 wherein the resistor is thermally connected to a Bragg reflector region of the semiconductor laser for continuous heating thereof.

9. An apparatus for suppressing stimulated Brillouin scattering comprising:

a source of a dither signal; and a tuner, responsive to the dither signal, for continuously tuning a laser to reduce stimulated Brillouin scattering caused therefrom, wherein the tuner responds to the dither signal to continuously bias a passive waveguide of the laser to control the tuning of the laser.

10. An apparatus for suppressing stimulated Brillouin scattering comprising:

a source of a dither signal; and a tuner, responsive to the dither signal, for continuously tuning a laser to reduce stimulated Brillouin scattering caused therefrom, wherein the tuner continuously injects a biasing current into a passive waveguide of the laser to continuously bias the passive waveguide.

11. A tunable distributed Bragg reflector laser for suppressing stimulated Brillouin scattering caused from its lasing output, the laser comprising:

a distributed Bragg reflector laser device including a semiconductor composition for generating the lasing output;

a dither source for providing a continuous dither signal; and a tuner, responsive to the dither signal, for continuously tuning the lasing output of the semiconductor composition to reduce stimulated Brillouin scattering of the lasing output therefrom.

12. The tunable laser of claim 11 wherein the dither source provides a continuously applied current as the dither signal to tune the semiconductor composition by controlling the lasing wavelength thereof.

13. The tunable laser of claim 12 wherein the dither source provides a sinusoidal current as the dither signal.

14. The tunable laser of claim 11 wherein the tuner includes an input region for receiving the dither signal.

15. The tunable laser of claim 11 wherein the tuner includes a resistor thermally connected to a portion of the semiconductor composition, the resistor responsive to the dither signal, for continuous heating thereof to control the tuning of the semiconductor composition.

16. The tunable laser of claim 15 wherein the resistor is thermally connected to a passive waveguide of the distributed Bragg reflector laser device for continuous heating thereof.

17. The tunable laser of claim 15 wherein the resistor is thermally connected to an active region of the distributed Bragg reflector laser device for continuous heating thereof.

18. The tunable laser of claim 15 wherein the resistor is thermally connected to a Bragg reflector region of the distributed Bragg reflector laser device for continuous heating thereof.

19. A tunable distributed Bragg reflector laser for suppressing stimulated Brillouin scattering caused from its lasing output, the laser comprising:

a distributed Bragg reflector device including a semiconductor composition for generating the lasing output;

a dither source for providing a continuous dither signal; and a tuner, responsive to the dither signal, for continuously tuning the lasing output of the semiconductor composition to reduce stimulated Brillouin scattering of the lasing output therefrom, wherein the tuner responds to the dither signal to continuously bias a passive waveguide of the semiconductor composition to control the tuning of the semiconductor composition.

20. A tunable distributed Bragg reflector laser for suppressing stimulated Brillouin scattering caused from its lasing output, the laser comprising:

a distributed Bragg reflector device including a semiconductor composition for generating the lasing output;

a dither source for providing a continuous dither signal; and a tuner, responsive to the dither signal, for continuously tuning the lasing output of the semiconductor composition to reduce stimulated Brillouin scattering of the lasing output therefrom, wherein the tuner responds to the dither signal to continuously inject a biasing current into a passive waveguide of the semiconductor composition to continuously bias the passive waveguide.

21. A method for suppressing stimulated Brillouin scattering caused by an output of a semiconductor laser, the method comprising the steps of:

receiving a dither signal at the semiconductor laser; and continuously tuning the semiconductor laser in response to the dither signal to reduce stimulated Brillouin scattering therefrom.

22. The method of claim 21 wherein the step of receiving includes the step of receiving a continuously applied current as the dither signal; and the step of continuously tuning includes the step of controlling the lasing wavelength in response to the dither signal.

23. The method of claim 22 wherein the step of receiving includes the step of receiving a continuous sinusoidal current as the dither signal.

24. The method of claim 21 wherein the step of receiving includes the step of receiving the dither signal at an input region of the semiconductor laser.

25. The method of claim 21 wherein the step of continuously tuning includes the steps of:
   continuously heating a portion of the semiconductor laser using a resistor in response to the dither signal; and
   controlling the tuning of the semiconductor laser by the continuous heating.

26. The method of claim 25 wherein the step of continuously heating includes the step of generating heat from the resistor thermally connected to a passive waveguide of the semiconductor laser.

27. The method of claim 25 wherein the step of continuously heating includes the step of generating heat from the resistor thermally connected to an active region of the semiconductor laser.

28. The method of claim 25 wherein the step of continuously heating includes the step of generating heat from the resistor thermally connected to a Bragg reflector region of the semiconductor laser for continuous heating thereof.

29. A method for suppressing stimulated Brillouin scattering caused by an output of a laser, the method comprising the steps of:
   receiving a dither signal; and
   continuously tuning the laser in response to the dither signal to reduce stimulated Brillouin scattering therefrom, including the steps of:
      continuously biasing a passive waveguide of the laser in response to the dither signal; and
      controlling the tuning of the laser by the continuous bias.

30. The method of claim 29 wherein the step of continuously biasing includes the step of:
   continuously injecting a biasing current into the passive waveguide of the laser.

* * * * *